(12) United States Patent
Makala et al.

(10) Patent No.: US 9,093,480 B2
(45) Date of Patent: Jul. 28, 2015

(54) SPACER PASSIVATION FOR HIGH ASPECT RATIO ETCHING OF MULTILAYER STACKS FOR THREE DIMENSIONAL NAND DEVICE

(71) Applicant: SanDisk Technologies, Inc., Plano, TX (US)

(72) Inventors: Raghuveer S. Makala, Campbell, CA (US); Yao-Sheng Lee, Tampa, FL (US); Johann Alsmeier, San Jose, CA (US); Henry Chien, San Jose, CA (US); Masanori Terahara, Yokkaichi (JP); Hirofumi Watatani, Yokkaichi (JP)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/135,931

(22) Filed: Dec. 20, 2013

(65) Prior Publication Data

US 2014/0295636 A1 Oct. 2, 2014

Related U.S. Application Data

(60) Provisional application No. 61/807,277, filed on Apr. 1, 2013.

(51) Int. Cl.
*H01L 21/336* (2006.01)
*H01L 29/66* (2006.01)
(Continued)

(52) U.S. Cl.
CPC ...... *H01L 29/66833* (2013.01); *H01L 27/1157* (2013.01); *H01L 27/11524* (2013.01);
(Continued)

(58) Field of Classification Search
CPC ..... H01L 27/11; H01L 27/115; H01L 27/112; H01L 29/66825; H01L 29/66833; H01L 29/7889; H01L 29/7926; H01L 27/11582; H01L 27/1157; H01L 27/11556; H01L 27/11524

USPC ................ 438/287, 283, 269, 270, 271, 272
See application file for complete search history.

(56) References Cited

U.S. PATENT DOCUMENTS 5,915,167 A 6/1999 Leedy
7,177,191 B2 2/2007 Fasoli et al.
(Continued)

FOREIGN PATENT DOCUMENTS

WO WO 2002/015277 A2 2/2002
WO WO2012/003301 A2 1/2012

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Kevin M Picardat
(74) *Attorney, Agent, or Firm* — The Marbury Law Group PLLC

(57) ABSTRACT

A method of making a semiconductor device includes forming a stack of alternating layers of a first material and a second material over a substrate, etching the stack to form at least one opening extending partially through the stack and forming a masking layer on a sidewall and bottom surface of the at least one opening. The method also includes removing the masking layer from the bottom surface of the at least one opening while leaving the masking layer on the sidewall of the at least one opening, and further etching the at least one opening to extend the at least one opening further through the stack while the masking layer remains on the sidewall of the at least one opening.

23 Claims, 7 Drawing Sheets

(51) Int. Cl.
*H01L 27/115* (2006.01)
*H01L 29/788* (2006.01)
*H01L 29/792* (2006.01)

(52) U.S. Cl.
CPC .... *H01L27/11556* (2013.01); *H01L 27/11582* (2013.01); *H01L 29/66825* (2013.01); *H01L 29/7889* (2013.01); *H01L 29/7926* (2013.01)

(56) References Cited

U.S. PATENT DOCUMENTS

| | | |
|---|---|---|
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,349,681 B2 | 1/2013 | Alsmeier et al. |
| 8,614,126 B1 | 12/2013 | Lee et al. |
| 2007/0210338 A1 | 9/2007 | Orlowski |
| 2007/0252201 A1 | 11/2007 | Kito et al. |
| 2009/0283819 A1 | 11/2009 | Ishikawa et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0266606 A1 | 11/2011 | Park et al. |
| 2012/0001247 A1 | 1/2012 | Alsmeier |
| 2012/0001249 A1 | 1/2012 | Alsmeier |
| 2012/0146127 A1 | 6/2012 | Lee et al. |
| 2012/0156848 A1 | 6/2012 | Yang et al. |
| 2012/0256247 A1 | 10/2012 | Alsmeier |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

U.S. Appl. No. 13/544,328, Raghuveer S. Makala et al., "Three Dimensional NAND Device and Method of Charge Trap Layer Separation and Floating Gate Formation in the NAND Device", filed Jul. 9, 2012, Specification and drawings.

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Li et al., "Sacrificial Polymers for Nanofluidic Channels in Biological Applications", Nanotechnology 14 (2003) 578-583.

U.S. Appl. No. 13/762,988, "Three Dimensional NAND Device and Semiconductor, Metal or Silicide Floating Gates and Method of Making Thereof," Raghuveer S. Makala et al., filed Feb. 8, 2013, Specification and drawings.

U.S. Appl. No. 13/933,743, "Method of Making a Vertical NAND Device Using Sequential Etching of Multilayer Stacks," Raghuveer S. Makala et al., filed Jul. 2, 2013, Specification and drawings.

International Search Report & Written Opinion received in connection with international application PCT/US2014/032123, dated Sep. 22, 2014.

European Patent Office, International Searching Authority, Invitation to Pay Additional Fees for PCT/US2014/032123, issued Jul. 15, 2014.

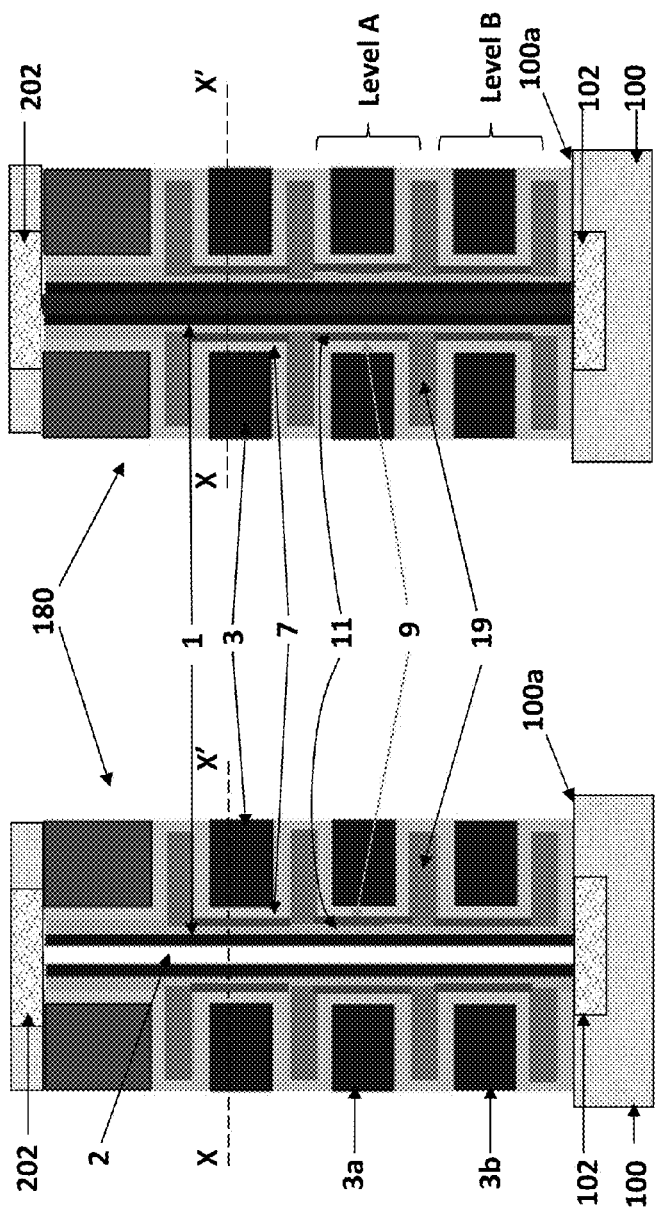

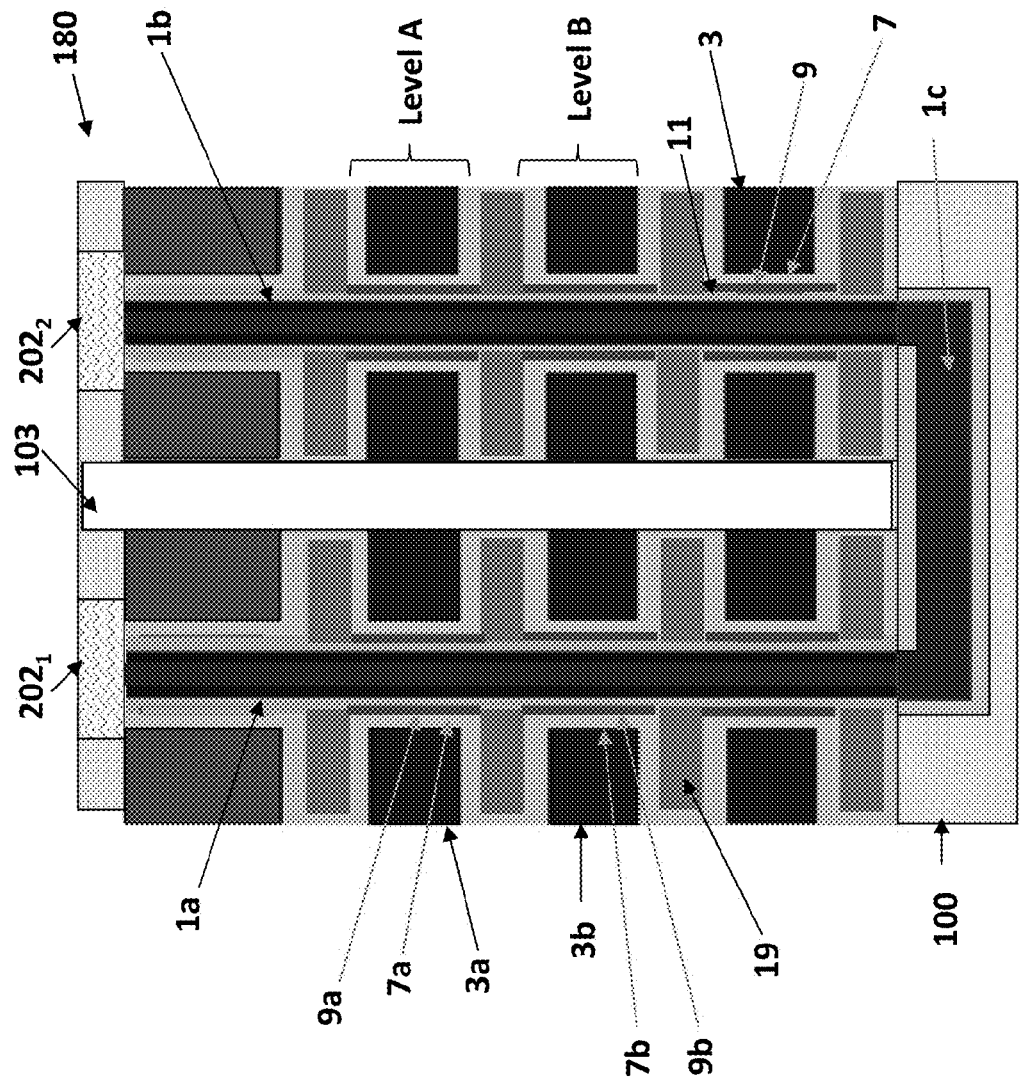

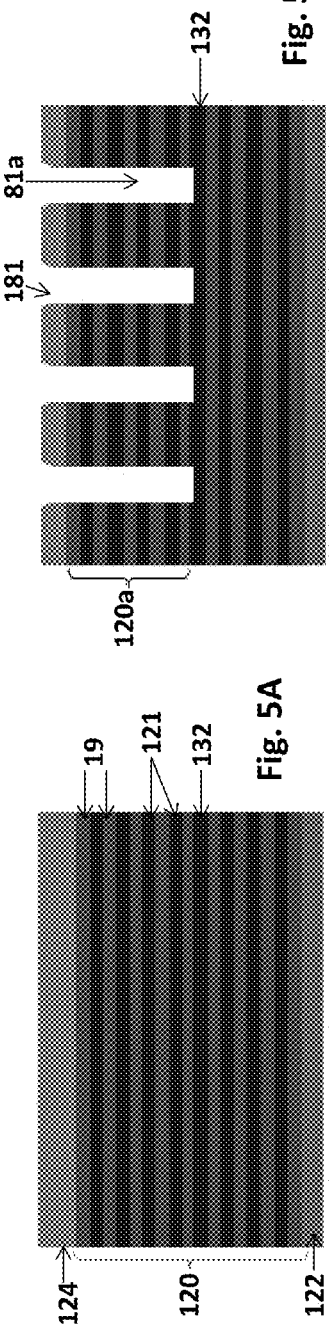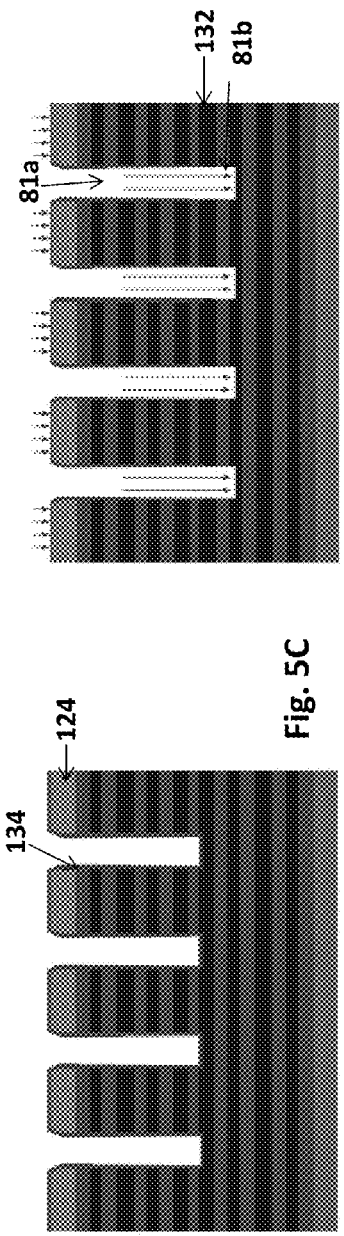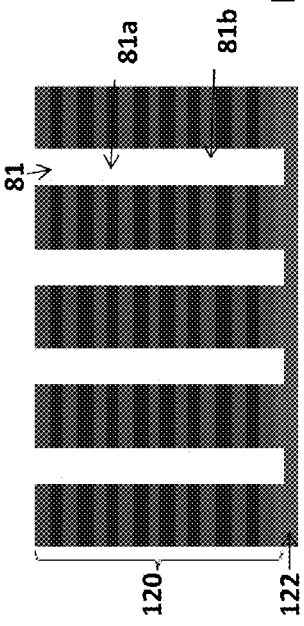

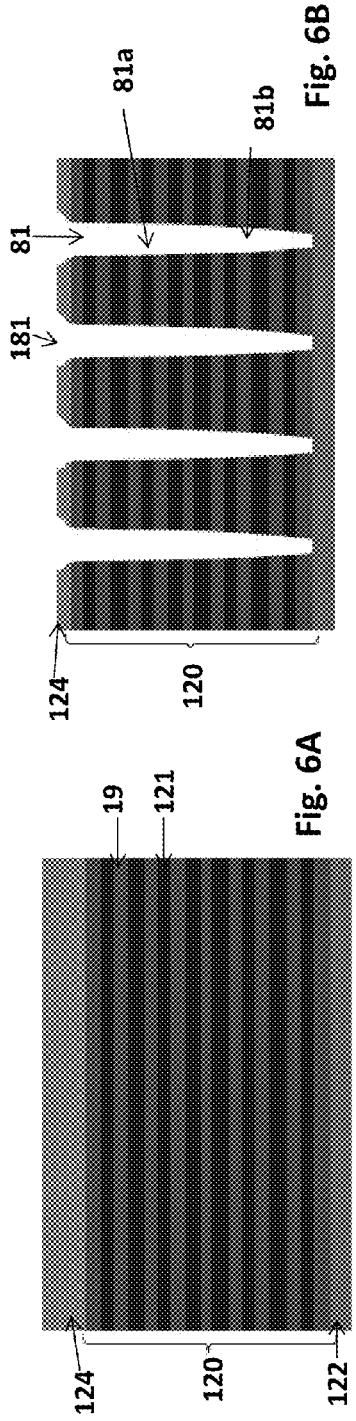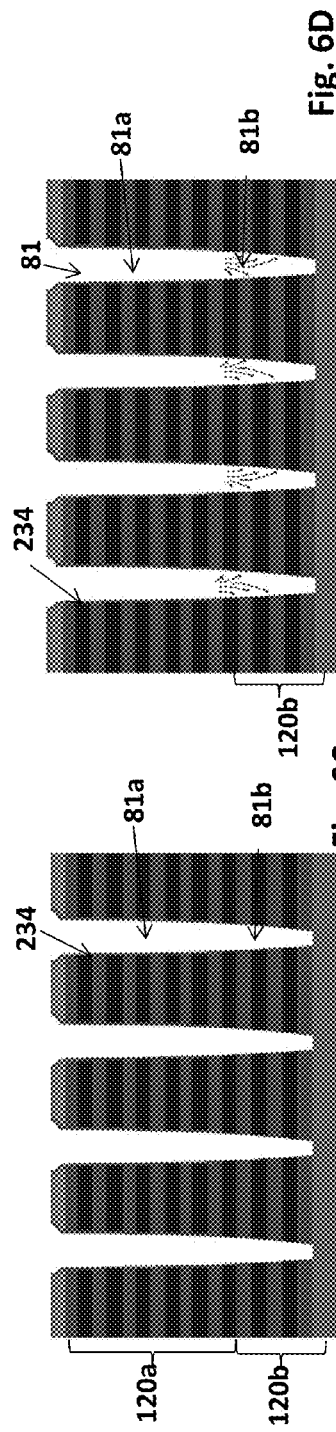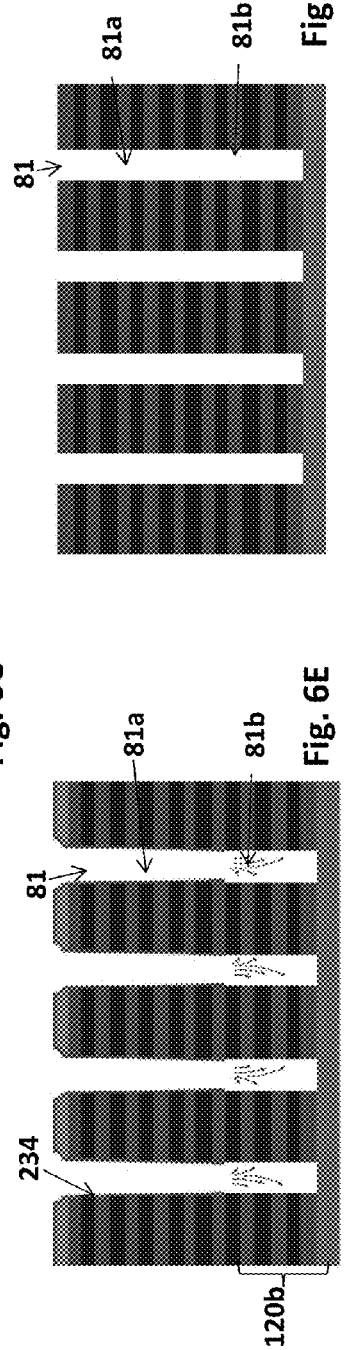

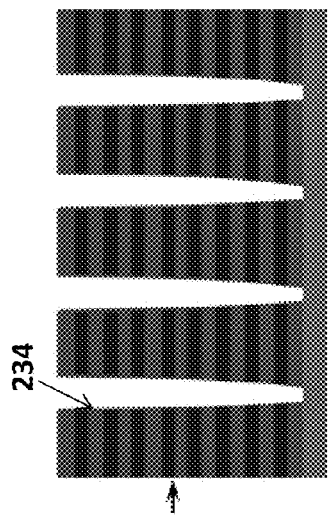
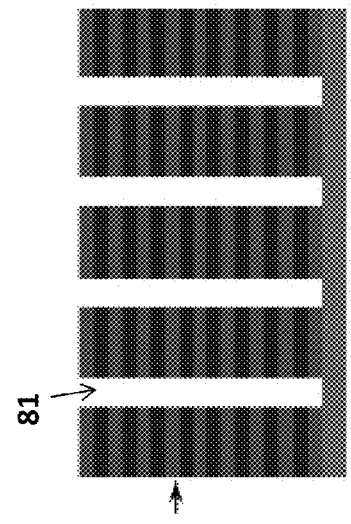
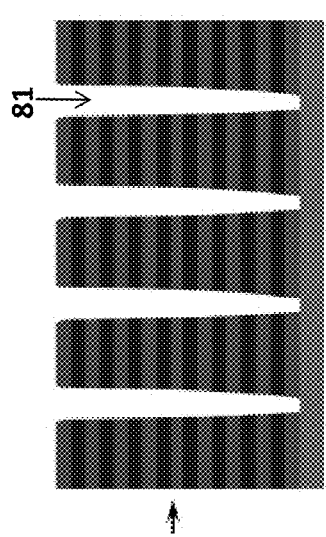
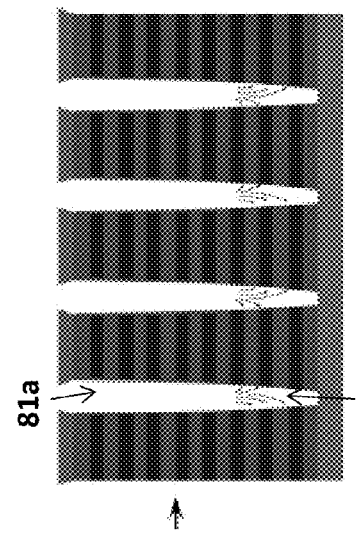
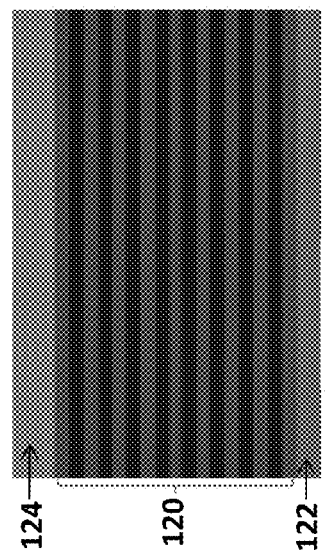
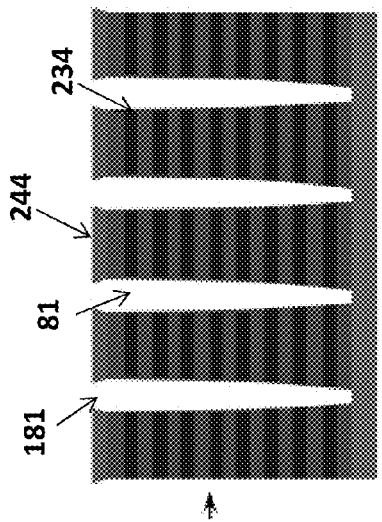

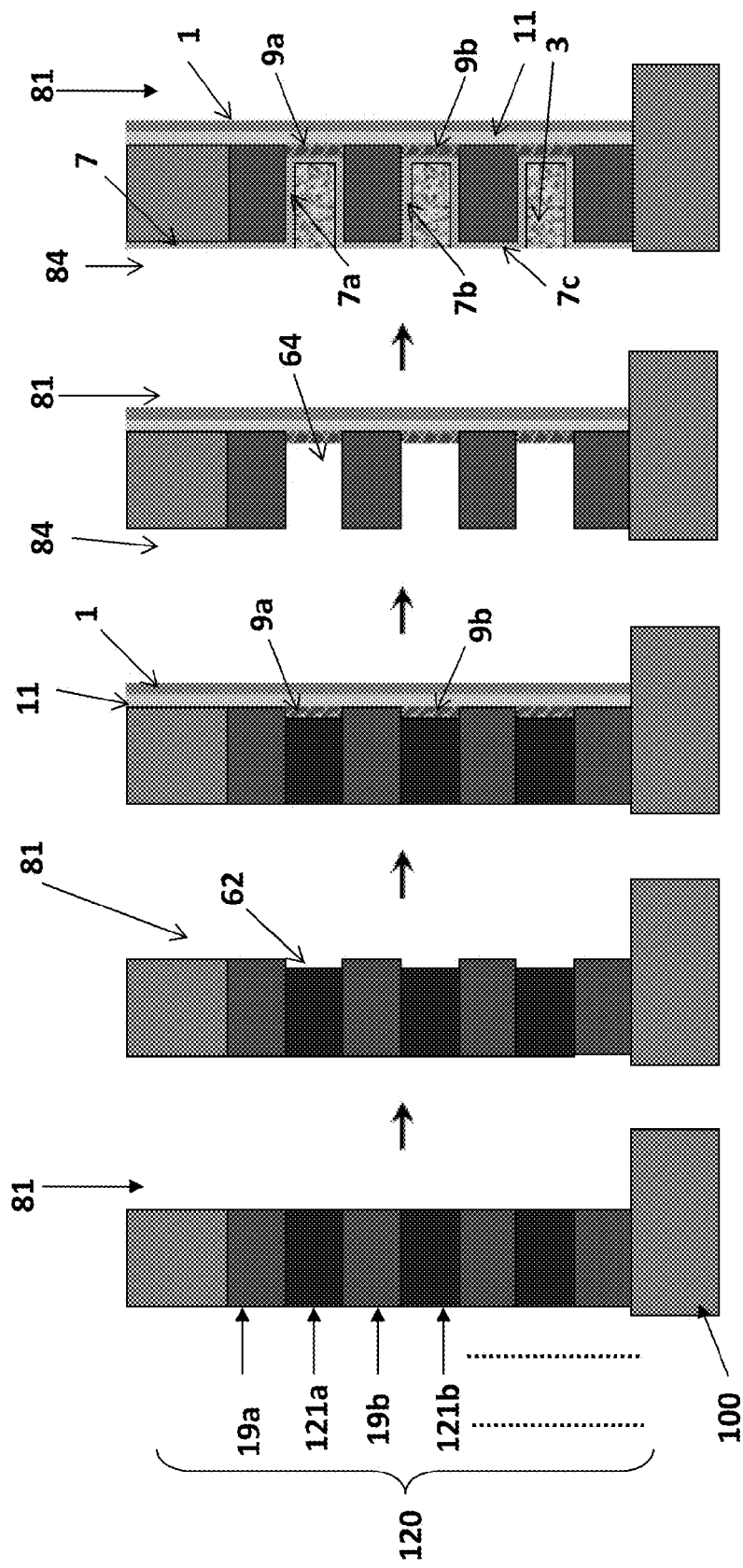

SPACER PASSIVATION FOR HIGH ASPECT RATIO ETCHING OF MULTILAYER STACKS FOR THREE DIMENSIONAL NAND DEVICE

FIELD

The present invention relates generally to the field of semiconductor devices and specifically a method of making three dimensional vertical NAND devices and other three dimensional devices.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a method of making a semiconductor device includes forming a stack of alternating layers of a first material and a second material over a substrate, etching the stack to form at least one opening extending partially through the stack and forming a masking layer on a sidewall and bottom surface of the at least one opening. The method also includes removing the masking layer from the bottom surface of the at least one opening while leaving the masking layer on the sidewall of the at least one opening, and further etching the at least one opening to extend the at least one opening further through the stack while the masking layer remains on the sidewall of the at least one opening.

Another embodiment relates to a method of making a semiconductor device including forming a stack of alternating layers of a first material and a second material over a substrate and etching the stack to form at least one opening in the stack. The at least one opening comprises a tapered opening having an upper portion which is wider than a lower portion. The method also includes forming a masking layer on a sidewall of the upper portion of the at least one opening while the lower portion of the at least one opening is not covered by the masking layer, and further etching the lower portion of the at least one opening to widen the lower portion of the at least one opening while the masking layer remains on the sidewall of the upper portion of the at least one opening.

BRIEF DESCRIPTION OF THE DRAWINGS

FIGS. 1A-1B are respectively side cross sectional and top cross sectional views of a NAND string of one embodiment. FIG. 1A is a side cross sectional view of the device along line Y-Y' in FIG. 1B, while FIG. 1B is a side cross sectional view of the device along line X-X' in FIG. 1A.

FIGS. 2A-2B are respectively side cross sectional and top cross sectional views of a NAND string of another embodiment. FIG. 2A is a side cross sectional view of the device along line Y-Y' in FIG. 2B, while FIG. 2B is a side cross sectional view of the device along line X-X' in FIG. 2A.

FIG. 3 is side cross sectional view of a NAND string of an embodiment with a U-shaped channel.

FIGS. 5A-5E, 6A-6F, 7A-7F and 8A-8E illustrate embodiment methods of making NAND strings.

DETAILED DESCRIPTION

Figure 4:
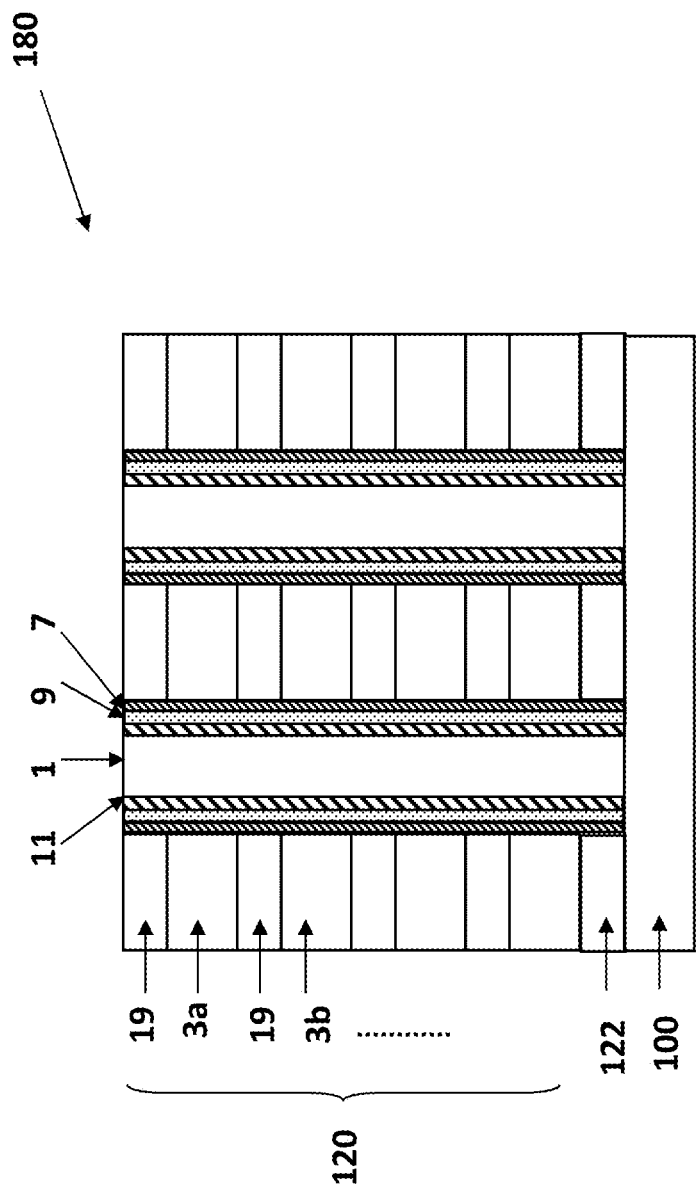
FIG. 4 is side cross sectional view of a NAND string of another embodiment.

The embodiments of the invention provide a monolithic, three dimensional array of semiconductor devices, such as an array of vertical NAND strings located in high aspect ratio openings which are formed using a sidewall spacer.

The present inventors realized that vertical NAND device fabrication relies heavily on reactive ion etching ("RIE") of very high aspect ratio (e.g., at least a 40:1, such as 40:1 to 100:1 height to width ratio) of memory openings in a stack of alternating layers. This etching suffers from several drawbacks, such as etch profile variation resulting in variation of critical diameter between the top and bottom of the memory opening, bowing across the length of the memory opening, hard mask erosion, and critical diameter non-uniformity between memory openings at the center, middle and edge of the substrate. These drawbacks limit the number of memory layers that can be controllably etched within acceptable process variations.

The embodiments of the present invention provide a solution to the aforementioned drawbacks by using a spacer passivation of memory opening sidewalls to improve the etch profiles of the multilayer stacks. In a first embodiment, the memory opening is partially etched in the stack followed by a conformal spacer deposition in the memory opening. The spacer protects the sidewalls of already etched features (e.g. upper layers of the stack) from being over etched. The memory opening etching is then continued to form the bottom part of the opening.

In a second embodiment, the memory opening is completely etched through the stack followed by a non-conformal spacer deposition in the memory opening. The deposition of the non-conformal spacer is tuned so that the thickness drops from a finite value (at the upper end of the memory opening) to near-zero thickness towards the lower end of the opening (preferably at about ⅔rds depth of the etched opening). An over etch step is then used to widen the critical diameter of the opening that is not protected by the spacer (in the lower end of the opening, such as in the lower third of the opening). In both embodiments, an additional step may be used to remove the spacer after the memory opening etching is completed.

The NAND strings are vertically oriented, such that at least one memory cell is located over another memory cell. This allows vertical scaling of NAND devices to provide a higher density of memory cells per unit area of silicon or other semiconductor material.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

In some embodiments, the monolithic three dimensional NAND string 180 comprises a semiconductor channel 1 having at least one end portion extending substantially perpendicular to a major surface 100a of a substrate 100, as shown in FIGS. 1A, 2A and 4. For example, the semiconductor channel 1 may have a pillar shape and the entire pillar-shaped semiconductor channel extends substantially perpendicularly to the major surface of the substrate 100, as shown in FIGS. 1A, 2A and 4. In these embodiments, the source/drain electrodes of the device can include a lower electrode 102 provided below the semiconductor channel 1 and an upper electrode 202 formed over the semiconductor channel 1, as shown in FIGS. 1A and 2A.

Alternatively, the semiconductor channel 1 may have a U-shaped pipe shape, as shown in FIG. 3. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are not shown in FIGS. 1-4 for clarity.

In some embodiments, the semiconductor channel 1 may be a filled feature, as shown in FIGS. 2A-2B, 3 and 4. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3 and/or the channel 1 shown in FIG. 4 may alternatively be a hollow cylinder filled with an insulating fill material 2, shown in FIGS. 1A-1B.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recyrstallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, 3 and 4. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, copper, aluminum, tantalum, titanium, cobalt, titanium nitride or alloys thereof. For example, the control gate material in FIGS. 1A, 2A and 3 may comprise a conductive metal or metal alloy, such as tungsten and/or titanium nitride, while the control gate material in FIG. 4 may comprise doped polysilicon.

A blocking dielectric 7 is located adjacent to the control gate(s) 3 and may surround the control gate 3, as shown in FIGS. 1A, 2A and 3. Alternatively, a straight blocking dielectric layer 7 may be located only adjacent to an edge (i.e., minor surface) of each control gate 3, as shown in FIG. 4. The blocking dielectric 7 may comprise a layer having plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIG. 3. Alternatively, the blocking dielectric 7 may be a straight, continuous layer, as shown in FIG. 4.

The monolithic three dimensional NAND string also comprise a charge storage region 9. The charge storage region 9 may comprise one or more continuous layers which extend the entire length of the memory cell portion of the NAND string, as shown in FIG. 4. For example, the charge storage region 9 may comprise an insulating charge trapping material, such as a silicon nitride layer.

Alternatively, the charge storage region may comprise a plurality of discrete charge storage regions 9, as shown in FIGS. 1A, 2A and 3. The plurality of discrete charge storage regions 9 comprise at least a first discrete charge storage region 9a located in the device level A and a second discrete charge storage region 9b located in the device level B, as shown in FIG. 3. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers).

FIGS. 5A-5E illustrate a method of making a high aspect ratio opening in a stack of alternating layers using sidewall spacer passivation of the opening according to a first embodiment of the invention.

Referring to FIG. 5A, a stack 120 of alternating layers 19 and 121 are formed over the major surface of the substrate 100. Layers 19, 121 may be deposited over the substrate by any suitable deposition method, such as sputtering, CVD, PECVD, MBE, etc. The layers 19, 121 may be 6 to 100 nm thick and there may be 32-64 pairs of layers 19, 121 in the stack 120. Layers 19 and 121 are comprised of different materials from each other.

The first layers 19 comprise an electrically insulating material. Any suitable insulating material may be used, such as silicon oxide, silicon nitride, silicon oxynitride, a high-k dielectric (e.g., aluminum oxide, hafnium oxide, etc. or an organic insulating material).

In one aspect of this embodiment, the second layers 121 comprise the control gate material, such as doped polysilicon. In this aspect, layers 121 will be retained in the final device as the control gates 3, and the memory film comprising the blocking dielectric 7, the charge storage region 9 and the tunnel dielectric 11 will be formed through the same front side memory opening as the channel 1 to form the NAND string shown in FIG. 4.

In another aspect of this embodiment, the second layers 121 comprise a sacrificial material, such a semiconductor material, conductive material (e.g., metal) or insulating material (e.g., silicon nitride). The sacrificial layers 121 will be eventually removed from the stack 120 though a back side opening and replaced with the combination of the electrically conductive control gates 3, such as tungsten control gates 3, and clam shaped blocking dielectric segments 7, as shown in FIGS. 1A, 2A and 3.

For example, sacrificial layers 121 may comprise silicon, such as amorphous silicon or polysilicon, or another semiconductor material, such as a group IV semiconductor, including silicon-germanium and germanium. Sacrificial layers 121 may comprise intrinsic or undoped (if the as-deposited material inherently has a low p-type or n-type conductivity) semiconductor material, such as intrinsic or undoped polysilicon or amorphous silicon. However, p-type or n-type doped semiconductor materials, such as lightly or heavily doped materials may also be used if desired. The term heavily doped includes semiconductor materials doped n-type or p-type to a concentration of above $10^{18}$ cm$^{-3}$. In contrast, lightly doped semiconductor materials have a doping concentration below $10^{18}$ cm$^{-3}$ and intrinsic semiconductor materials have a doping concentration below $10^{15}$ cm$^{-3}$.

If desired, an optional lower etch stop layer 122 may be formed below the stack 120. If the stack 120 comprises silicon oxide layers 19 and doped polysilicon layers 121, then the etch stop layer 122 may comprise silicon nitride or another material which has a lower etch rate than the etch rate of layers 19 and 121. For example, the etch stop layer 122 may be made of a mid-k to high-k metal oxide, such as an aluminum based dielectric (e.g., stoichiometric Al$_2$O$_3$ or non-stoichiometric aluminum oxide) or a titanium based dielectric (e.g., stoichiometric TiO$_2$ or non-stoichiometric titanium oxide), or a tantalum based dielectric (e.g., stoichiometric Ta$_2$O$_5$ or non-stoichiometric tantalum oxide), or nitrogen doped silicon carbide (e.g., silicon carbonitride, SiC(N)) which is resistant to fluorine based plasma. Alternatively, the etch stop layer may comprise aluminum nitride, aluminum oxynitride, silicon carbide or another suitable etch stop material. The etch stop is typically thin, such as 10-70 nm, such as 20-50 nm thick.

If desired, an optional intermediate etch stop layer 132 may be located in the stack 120, such as between the top 25% and bottom 25% of the stack height, for example at the 50% of the stack height. Layer 132 may comprise the same or different etch stop material as layer 122. For example, layer 132 may be a silicon nitride layer 132 in a stack of silicon oxide 19 and polysilicon layers 121. In summary, the intermediate etch stop layer 132 may be formed between a lower portion and an upper portion of the stack 120, and/or the lower etch stop layer 122 may be formed under the stack 120.

Furthermore, an optional hard mask layer or layers 124 may be formed over the stack. The hard mask layer 124 may be any suitable hard mask material which has a lower etch rate than the stack layers 19, 121. For example, the hard mask layer 124 may comprise amorphous carbon, doped carbon, silicon nitride, silicon carbide, tungsten, tungsten nitride etc.

As shown in FIG. 5B, the stack 120 is etched to form at least one memory opening 81a extending partially through the stack 120 (e.g., through the upper portion 120a of the stack). Preferably, a plurality of memory openings 81a are formed, as shown in FIG. 5B.

The openings 81a may be formed by patterning the hard mask 124 to form at least one hard mask opening 181 which exposes the stack 120, followed by etching the stack 120 through the at least one hard mask opening 181 to form at least one opening 81a extending partially through the upper portion 120a of the stack 120. The openings 81a may be formed by photolithographic patterning of a photoresist (not shown for clarity), etching the hard mask layer 124 using the patterned photoresist as a mask to form openings 181, followed by RIE of the upper portion 120a of the stack 120 through openings 181 using the patterned hard mask layer 124 as a mask.

Each opening 81a may extend 25% to 75% through the stack 120, such as about half way through the stack, stopping on any suitable layer in the stack. If the optional intermediate etch stop layer 132 is located in the stack 120, then the partial etch stops on layer 132.

As shown in FIG. 5C, a masking layer 134 is formed on a sidewall and bottom surface of the at least one opening 81a. Preferably, layer 134 is formed on sidewalls and bottom surfaces of all openings 81a and over the top surface of the hard mask 124. The masking layer 134 preferably comprises a conformal spacer deposited by atomic layer deposition (ALD) or chemical vapor deposition (CVD). Layer 134 is deposited conformally in the openings 81a such that it does not fill the entire volume of the openings 81a. As noted above, layer 134 may have a thickness of 3 to 50 nm, such as 5 to 25 nm, and may be made of any suitable protective material, such as amorphous carbon, silicon nitride, silicon oxide, metal oxide or metal nitride (e.g., HfOx, TaOx, AlOx, AlNx, etc.).

The masking layer 134 is removed from the bottom surface of the at least one opening 81a while leaving the masking layer on the sidewall of the at least one opening 81a, as shown in FIG. 5D. Layer 134 may also removed from the top surface of the hard mask layer 124. The removal step preferably comprises a highly directional RIE step, similar to a sidewall spacer etch step, as shown by the arrows in FIG. 5D. A low pressure, high bias RIE process can be used for strong ion bombardment.

After removing layer 134 at the bottom of the openings 81a, the RIE process shown in FIG. 5D may optionally be continued to extend the openings 81a into the lower part of the stack to form openings 81b. Alternatively, the RIE process stops after removing layer 134 from the bottom of the upper openings 81a and the etching chemistry is switched to etch the lower openings 81b in the lower part of the stack 120. In either case, the further etching of the at least one opening 81a using the same RIE chemistry or a different etching chemistry extends the at least one opening further through the stack while the masking layer 134 remains on the sidewall of the at least one opening 81a. If the intermediate etch stop layer 132 is present in the stack, then the further etching extends the at least one opening 81a through the intermediate etch stop layer 132 and through the lower portion of the stack 120 to the lower etch stop layer 122 while the masking layer 134 remains on the sidewall of the at least one opening 81a. If desired, the opening may be etched further through the lower etch stop layer 122 to extend to the underlying layer(s) or substrate, as shown in FIG. 4. For example, the opening may extend to the lower electrode 102 shown in FIGS. 1A and 2A.

After completion of the further etching of the openings 81, the masking layer 134 is removed from the sidewalls of the openings 81. If the masking layer 134 comprises an amorphous carbon masking layer, then the step of removing the masking layer from the sidewall may comprise ashing the amorphous carbon masking layer. Alternatively, for other masking layer 134 materials, the step of removing the masking layer from the sidewall may comprise selectively wet etching the masking layer 134 without removing the other layers 19, 121 of the stack. This completes the formation of the memory openings 81.

The completed memory openings 81 composed of upper portions 81a and lower portions 81b are shown in FIG. 5E. The openings 81 extend at least to the lower etch stop layer 122 or through the lower etch stop layer 122. The hard mask layer 124 may be partially or fully consumed during the etching of the lower portions 81b of the openings 81, as shown in FIG. 5E.

An array of memory openings 81 (i.e., front side openings) is formed in locations where the memory film and vertical channels of NAND strings will be subsequently formed, as shown in FIG. 4. For example, if layers 121 comprise a control gate material, such as doped polysilicon, then the etching of the memory openings 81 patterns layers 121 into control gates 3. The memory film (e.g., blocking dielectric 7, charge storage region 9 and tunnel dielectric 11) and the channels 1 are then deposited into the memory openings 81 to complete the memory levels of the NAND strings, as shown in FIG. 4. Specifically, the blocking dielectric 7 is formed in the at least one opening 81, the charge storage layer 9 is formed over the blocking dielectric 7, the tunnel dielectric 11 is formed over the charge storage layer 9, and the semiconductor channel 1 is formed over the tunnel dielectric 11 in the at least one opening 81. If desired, the insulating fill layer 2 may also be deposited into the memory openings, as shown in FIG. 2A.

FIGS. 6A-6F illustrate a method of making a high aspect ratio opening in a stack of alternating layers using sidewall spacer passivation of the opening according to a second embodiment of the invention.

FIG. 6A illustrates the same stack 120 of alternating layers of a first material 19 and a second material 121 as in FIG. 5A. The stack may also contain the optional lower etch stop 122 and hard mask 124 layers as in FIG. 5A. However, the intermediate etch stop layer 132 is preferably omitted in the stack shown in FIG. 6A.

Then, as shown in FIG. 6B, the stack 120 is etched to form at least one memory opening 81 in the stack 120. The at least one opening 81 preferably comprises a plurality of openings 81 formed by a method similar to the method described above with respect to FIG. 5B. However, the openings 81 in FIG. 6B differ from the openings 81a in FIG. 5B in that they extend through the entire stack 120, such as to the etch stop layer 122 under the stack, and in that the openings 81 are preferably tapered openings having an upper portion 81a which is wider than a lower portion 81b. The openings 81 may be formed by RIE through openings 181 in the patterned hard mask 124.

As shown in FIG. 6C, a masking layer 234 is formed on a sidewall of the upper portion 81a of the at least one opening 81 in the upper portion 120a of the stack 120. Layer 234 is also formed on the upper surface of the stack 120. The lower portion 81b of the at least one opening 81 is not covered by the masking layer 234. Preferably, layer 234 comprises a non-conformal sidewall spacer because it does not cover the sidewall of the lower portion 81b of the opening 81. This nonconformal layer 234 may be referred to as a "semiconformal" layer because it covers the hard mask 124 and upper portion 81a of the opening 81. Layer 234 may be made of any suitable protective material, such as amorphous carbon, silicon nitride, silicon oxide, metal oxide or metal nitride (e.g., HfOx, TaOx, AlOx, AlNx, etc.). Layer 234 deposition is tuned so that the thickness drops from a finite value (e.g., 3-50 nm in the upper portion 81a of the memory opening 81) to zero or near-zero thickness in the lower portion 81b of the opening 81. Preferably, layer 234 thickness drops to zero or below 1 nm between 50% and 75% of the depth of the opening 81, such as at about 65-68% depth of the etched opening 81. In other words, the lower portion 81b of the opening 81 comprises the lower 25 to 50% of the opening, such as the lower third of the opening 81 in the lower portion 120b of the stack 120.

As shown by the arrows in FIGS. 6D and 6E, an over etch step is then used to widen the critical diameter of the lower portion 81b of the opening 81 that is not protected by layer 234. Specifically, the over etch comprises further etching the lower portion 81b of the at least one opening 81 to widen the lower portion 81b of the at least one opening while the masking layer 234 remains on the sidewall of the upper portion 81a of the at least one opening 81. Thus, layers 19 and 121 (e.g., control gates) in the upper portion 120a of the stack are protected by layer 234 from further etching while the layers 19 and 121 in the lower portion 120b of the stack are further etched in the step shown in FIGS. 6D and 6E. The further etching step shown in FIGS. 6D and 6E may comprise an RIE step and/or a wet etching (e.g., wet clean) step.

After completion of the further etching of the openings 81, the masking layer 234 is removed from the sidewalls of the openings 81, as shown in FIG. 6F. If the masking layer 234 comprises an amorphous carbon masking layer, then the step of removing the masking layer from the sidewall may comprises ashing the amorphous carbon masking layer. Alternatively, for other masking layer 234 materials, the step of removing the masking layer from the sidewall may comprise selectively wet etching the masking layer 234 without removing the other layers 19, 121 of the stack. This completes the formation of the memory openings 81.

The completed memory openings 81 composed of upper portions 81a and lower portions 81b are shown in FIG. 6F. The openings 81 extend at least to the lower etch stop layer 122 or through the lower etch stop layer 122. The hard mask layer 124 may be partially or fully consumed during the etching of the lower portions 81b of the openings 81, as shown in FIG. 6F.

An array of memory openings 81 (i.e., front side openings) is formed in locations where the memory film and vertical channels of NAND strings will be subsequently formed, as shown in FIG. 4. For example, if layers 121 comprise a control gate material, such as doped polysilicon, then the etching of the memory openings 81 patterns layers 121 into control gates 3. The memory film (e.g., blocking dielectric 7, charge storage region 9 and tunnel dielectric 11) and the channels 1 are then deposited into the memory openings 81 to complete the memory levels of the NAND strings, as shown in FIG. 4. Specifically, the blocking dielectric 7 is formed in the at least one opening 81, the charge storage layer 9 is formed over the blocking dielectric 7, the tunnel dielectric 11 is formed over the charge storage layer 9, and the semiconductor channel 1 is formed over the tunnel dielectric 11 in the at least one opening 81. If desired, the insulating fill layer 2 may also be deposited into the memory openings, as shown in FIG. 2A.

FIGS. 7A-7F show alternative steps of the method of the second embodiment. In this method, an additional hard mask layer is formed over the masking layer 234.

FIG. 7A illustrates the same stack 120 of alternating layers of the first material 19 and the second material 121 as in FIG. 6A. The stack may also contain the lower etch stop 122 and hard mask 124 layers as in FIG. 6A. Then, as shown in FIG. 7B, the stack 120 is etched to form at least one memory opening 81 in the stack 120 using RIE, similar to the step described above with respect to FIG. 6B. The RIE step is followed by stripping the hard mask layer 124 by ashing or selective wet etching.

As shown in FIG. 7C, the masking layer 234 is formed on a sidewall of the upper portion 81a of the at least one opening 81 in the upper portion 120a of the stack 120, similar to the step described above with respect to FIG. 6B. Layer 234 is also formed on the upper surface of the stack 120.

Then, as shown in FIG. 7D, an additional hard mask 244 is formed over a portion of the masking layer 234 located over the upper surface of the stack 120. The hard mask 244 is formed non-conformally such that it is formed only on the upper surface of the stack 120, but not in the openings 81. This forms hard mask openings 181 in the hard mask 244. The hard mask 244 may comprise an amorphous carbon hard mask.

The method then proceeds similar to the method illustrated in FIGS. 6D-6F. Specifically, the lower portion 81b of the at least one opening 81 is etched through the openings 181 in the additional hard mask 244 to widen the lower portion 81b of the at least one opening 81, as shown in FIG. 7E. Finally, as shown in FIG. 7F, layer 234 and the hard mask 244 are removed similar to the step described above with respect to FIG. 6F.

In the above methods, amorphous carbon hard mask shape may be improved by an optional flash step. This may improve the masking layer deposition and memory opening profile.

The first and second embodiments described above contain doped semiconductor layers 121 which form the control gates 3 of the NAND strings, as shown in FIG. 4. In alternative embodiments layers 121 may be sacrificial layers which are removed and replaced by conductive control gates 3, as shown in FIGS. 8A-8E.

A portion of the stack 120 containing insulating first layers 19 (e.g., 19a, 19b, etc.) and sacrificial second layers 121 (e.g., 121a, 121b, etc.) is shown in FIG. 8A. The front side opening (i.e., the memory opening 81) is formed in the stack 120 using the method of the first or the second embodiment described above.

Next, in an optional step as shown in FIG. 8B, the second material 121 is selectively etched compared to the first material 19 to form front side recesses 62 in the second material 121 (i.e., layers 121a, 121b, etc). The recesses 62 may be formed by selective, isotropic wet or dry etching which selectively etches the second material 121 compared to the first material 19. The depth of each recess 62 may be 3 to 20 nm. This step may be omitted if desired.

As shown in FIG. 8C, a plurality of discrete semiconductor, metal or silicide charge storage regions 9 are selectively formed on portions of the second material layers 121 exposed in the front side opening 81. The charge storage regions 9 comprise a plurality of charge storage segments or regions (e.g., 9a and 9b) located on the exposed edges of the second material 121 in the front side recesses 62.

In one embodiment, the charge storage regions 9 are selectively formed by selective growth of the regions on the exposed edges of the semiconductor second material layers 121 but not on the exposed insulating first material layers 19. Any suitable selective growth methods may be used to form the charge storage regions 9, such as chemical vapor deposition.

In one aspect of the selective growth embodiment, charge storage regions 9 comprise doped polysilicon regions which are selectively grown by CVD on the portions of the undoped or intrinsic second material layers 121 (e.g., undoped or intrinsic semiconductor having a polycrystalline or amorphous structure, such as polysilicon, amorphous silicon, silicon germanium or germanium) exposed in the front side opening 81. For example, the doped polysilicon regions 9 may comprise boron doped, p-type polysilicon regions (e.g., lightly or heavily doped) which are selectively, epitaxially grown on polysilicon layer 121 edges exposed in the front side openings 81. The doped polysilicon regions 9 are not grown on portions of the first material layers 19 (e.g., silicon oxide) exposed in the front side opening 81.

Any suitable silicon selective epitaxial growth (SEG) conditions may be used to form regions 9. For example, a chemical vapor deposition (CVD) SEG process which combines a silicon source gas and a silicon growth inhibitor gas which inhibits silicon growth on the oxide layers 19 may be used. Exemplary silicon source gases include silane and chlorosilanes (e.g., $SiH_4$, $SiH_2Cl_2$, and/or $SiHCl_3$). Exemplary inhibitor gases which inhibit silicon growth on $SiO_2$ include HCl and/or $Cl_2$. $H_2$ may be used as a carrier gas while $B_2H_6$, $AsH_3$ and/or $PH_3$ gases may be added to introduce dopants to the silicon regions 9. Any suitable SEG temperatures and pressures may be used, such as a temperature of 500 to 800 C and a pressure of 10 mTorr to 100 Torr (i.e., LPCVD). Similar process conditions may be used to form germanium or silicon-germanium charge storage regions 9, where germane ($GeH_4$) is substituted for silane or provided in addition to silane, at lower temperatures (e.g., 340 to 380 C) and pressure of about 10 mTorr −5 Torr, such as about 1 Torr.

In another aspect of the selective growth embodiment, charge storage regions 9 comprise selectively grown metal or silicide charge storage regions, such as on the portions of the second material layers exposed in the front side opening. Any metal (i.e., pure metal or conductive metal alloy) or metal silicide which may be selectively grown on exposed semiconductor layer 121 in the opening 81 may be used. For example, the charge storage regions 9 may comprise selectively grown tungsten, molybdenum or tantalum regions that are selectively grown on the semiconductor material (e.g., silicon) 121 but not on insulating material (e.g., silicon oxide) 19 from a metal halide source gas (e.g., tungsten hexafluoride) in a CVD process.

Selective deposition of refractory metals, such as W, Mo or Ta, on silicon may be performed by metal halide source gas reduction by $SiH_4$, where a ratio of $SiH_4$ to metal halide is less than one. For example, as disclosed in U.S. Pat. Nos. 5,084,417 and 5,807,788, incorporated herein by reference in their entirety, in the selective CVD process, the metal halide source gas may comprise $WF_6$, $MoF_6$ or $TaCl_5$ and the deposition temperature and pressure may range from 370 to 550 C and 100 to 500 mTorr, respectively. The ratio of the SiH$_4$/metal halide flow rates may range between 0.4 and 0.6.

If the front side recesses 62 are present, then the regions 9 may be selectively grown in the front side recesses 62 until their edges are about even with the edges of the insulating material 19 such that they form a relatively straight sidewall of the front side opening 81 (e.g., as much as a timed selective growth permits). Alternatively, the selective growth of regions 9 is terminated before regions 9 completely fill the recesses 62. Thus, regions 9 may partially fill recesses 62 and may remain horizontally recessed in the opening 81 compared to insulating material layers 19. Alternatively, the selective growth of regions 9 is terminated after regions 9 completely fill the recesses 62 such that the regions 9 protrude horizontally into the front side opening 81 past layers 19, as shown in FIG. 8C.

In another embodiment, the regions 9 are selectively formed by doping of the semiconductor layers 121 exposed in the front side opening 81. For example, when layers 121 comprise intrinsic or undoped semiconductor layers, a timed gas phase diffusion doping may be carried out to dope the edge portions 9 of layers 121 facing the opening 81 by providing a doping gas through the opening 81. The doping is terminated before the entire volume of layers 121 are doped, such that portions of layers 121 located behind regions 9 and facing away from the opening 81 remain undoped. For example, for Group IV semiconductor material (e.g., silicon) layers 121, the doping gas may comprise a boron containing gas, such as diborane, to form p-type doped regions 9, or a phosphorus or arsenic containing gas, such as phosphine or arsene, to form n-type doped regions 9.

In the next step shown in FIG. 8C, a tunnel dielectric layer 11 is deposited over the charge storage regions 9*a*, 9*b* and the insulating first material layers 19 between the charge storage regions in the front side opening 81. Then, the channel 1 is formed by depositing channel material 1, such as a lightly doped or intrinsic polysilicon over the tunnel dielectric layer 11 in the front side opening 81. If desired, a high temperature anneal may be performed after forming the channel.

As discussed above, the entire opening 81 may be filled to form the device illustrated in FIGS. 2A and 2B. Alternatively, a layer of channel material may first be deposited in the opening 81 followed by deposition of an insulating fill material 2 to form the device illustrated in FIGS. 1A and 1B. If desired, the channel 1 may be U-shaped as illustrated in FIG. 3.

The channel 1 may be formed by filling the front side opening 81 with a lightly doped semiconductor material (e.g., polysilicon) and then etched back from the top to form the pillar shaped (or U-shaped) channel 1 in the opening 81. In the embodiment of FIG. 3, the space between the wings of the U-channel 1 is filled with a gap fill insulating layer 103, such as silicon oxide or another material. Layer 103 may be formed by etching the stack 120 to form a rail shaped cut, followed by depositing an oxide layer followed by etch back or chemical mechanical polishing to form a planar top surface exposing the top surfaces of the channels 1. The channels are then connected to source and drain electrodes 102, 202 as shown in FIGS. 1-3, the select gate electrodes (not shown for clarity) are connected to select gate contacts and the control gate electrodes 3 are connected to word line contacts as known in the art.

In the next step shown in FIG. 8D, the stack 120 is patterned to form one or more back side openings 84 in the stack. The back side opening(s) 84 may be formed by photolithography and anisotropic etching of the stack. Preferably, the opening(s) 84 have a slit trench shape.

Then, at least a portion of the second material layers 121 are removed through the back side opening 84 to form back side recesses 64 between the first material layers 19. For example, layers 121 may be removed completely by selective wet etching using a liquid etching medium which selectively etches the material of layers 121 compared to the materials of layers 19 and regions 9. For example, if layers 121 comprise undoped or intrinsic polysilicon, layers 19 comprise silicon oxide and regions 9 comprise doped polysilicon, silicide or metal, then an undoped polysilicon selective etch may be used which stops on doped polysilicon (e.g., p-type polysilicon) regions 9 which act as an etch stop. Alternatively, the selective etch may be a timed etch which is timed to remove only a portion of the sacrificial second material layers 121 through the back side opening 84. In this case, a remaining portion of the second material layers 121 rather than regions 9 remain exposed in the back side recesses 64.

Then, as shown in FIG. 8E, the blocking dielectric layer 7 (also known as an inter-poly dielectric, IPD) is then formed in the back side recesses 64 through the back side opening 84 such that the blocking dielectric coats the sides of the back side recesses 64 and the back side of layers 19 exposed in the back side opening 84. The blocking dielectric layer 7 may comprise a silicon oxide layer deposited by conformal atomic layer deposition (ALD) or chemical vapor deposition (CVD). Other high-k dielectric materials, such as hafnium oxide, aluminum oxide, or multi-layer dielectrics (e.g., ONO) may be used instead or in addition to silicon oxide. Optionally, an insulating capping layer (e.g., silicon nitride) may be deposited into the openings before the blocking dielectric 7 and may comprise a back portion of a multi-layer blocking dielectric. The blocking dielectric 7 may have a thickness of 6 to 20 nm. An optional anneal, such as a rapid thermal anneal, may be conducted after the blocking dielectric formation.

The blocking dielectric layer 7 comprises a plurality of clam-shaped blocking dielectric segments 7*a*, 7*b* in the back side recesses 64 connected to each other by vertical portions 7*c* of the blocking dielectric layer 7 located on the exposed edges of the first material layers 19 in the back side opening 84. As used herein a "clam" shape is a side cross sectional shape configured similar to an English letter "C". A clam shape has two segments which extend substantially parallel to each other and to the major surface 100*a* of the substrate 100. The two segments are connected to each other by a third segment which extends substantially perpendicular to the first two segments and the surface 100*a*. Each of the three segments may have a straight shape (e.g., a rectangle side cross sectional shape) or a somewhat curved shape (e.g., rising and falling with the curvature of the underlying topography). The term substantially parallel includes exactly parallel segments as well as segments which deviate by 20 degrees or less from the exact parallel configuration. The term substantially perpendicular includes exactly perpendicular segments as well as segments which deviate by 20 degrees or less from the exact perpendicular configuration. The clam shape preferably contains an opening bounded by the three segments and having a fourth side open.

The opening in the clam shaped blocking dielectric segments is then filled by a control gate 3 material. As described above, the control gate material may comprise a thin barrier layer/adhesion layer such as titanium nitride or tungsten nitride and metal, such as tungsten or a combination of tungsten and titanium nitride layers. The control gate material may be deposited by CVD and fills the remaining volume of the back side recesses 64 inside the clam shaped blocking dielectric 7 segments and the entire back side opening 84. The deposition of the control gate material is followed by etching the control gate material to remove it from the back side opening 84 using anisotropic etching, while leaving the control gate material inside the back side recesses 64 in the clam shaped blocking dielectric 7 segments. The remaining control gate material inside the back side recesses 64 forms the control gates 3 of the vertical NAND string.

While the formation of the high aspect ratio openings was described above with respect to forming memory openings 81 for a vertical NAND string, the methods described above may be applied to any other suitable device. For example, the methods of the first or the second embodiments described above may be used to form any high aspect ratio opening, such as trenches, slits, holes, spaces between mesas or pillars, or other three dimensional shapes in any memory, logic or other semiconductor device.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a semiconductor device, comprising:
    forming a stack of a first set of alternating layers of a first material and a second material, a first etch stop layer, and a second set of alternating layers of the first material and the second material over a substrate, the first set of alternating layers constituting a lower portion of the stack, the second set of alternating layers constituting an upper portion of the stack, and the first etch stop layer being located between the lower portion and the upper portion of the stack and comprising a material different from the first material and the second material;
    forming a hard mask over the stack;
    patterning the hard mask to form at least one hard mask opening which exposes the stack;
    etching the upper portion of the stack through the at least one hard mask opening to form at least one opening extending partially through the upper portion of the stack to the first etch stop layer;
    forming a masking layer on a sidewall and bottom surface of the at least one opening;
    removing the masking layer from the bottom surface of the at least one opening while leaving the masking layer on the sidewall of the at least one opening; and
    further etching the at least one opening to extend the at least one opening through the first etch stop layer and further through the lower portion of the stack while the masking layer remains on the sidewall of the at least one opening.

2. The method of claim 1, wherein removing the masking layer from the bottom surface of the at least one opening comprises using directional reactive ion etching to remove the masking layer from the bottom surface of the at least one opening.

3. The method of claim 1, wherein the masking layer comprises a conformal masking layer.

4. The method of claim 3, wherein the conformal masking layer comprises an amorphous carbon, silicon nitride, silicon oxide, metal oxide or metal nitride masking layer.

5. The method of claim 1, further comprising removing the masking layer from the sidewall of the at least one opening after the step of further etching.

6. The method of claim 5, wherein the masking layer comprises an amorphous carbon masking layer and the step of removing the masking layer from the sidewall comprises ashing the amorphous carbon masking layer.

7. The method of claim 5, wherein the step of removing the masking layer from the sidewall comprises selectively wet etching the masking layer.

8. The method of claim 1, further comprising:
    forming a second etch stop layer under the stack;
    wherein forming the masking layer comprises forming the masking layer over an upper surface of the hard mask in addition to forming the masking layer on the sidewall and the bottom surface of the at least one opening; and
    wherein further etching comprises further etching the at least one opening to extend the at least one opening to the second etch stop layer while the masking layer remains on the sidewall of the at least one opening.

9. The method of claim 1, further comprising:
    forming a blocking dielectric in the at least one opening;
    forming a charge storage layer over the blocking dielectric;
    forming a tunnel dielectric over the charge storage layer; and
    forming a semiconductor channel over the tunnel dielectric in the at least one opening.

10. The method of claim 9, wherein:
    the semiconductor device comprises a monolithic three dimensional NAND string;
    the first material comprises a conductive or semiconductor control gate material; and
    the second material comprises an insulating material.

11. A method of making a semiconductor device, comprising:
    forming a stack of alternating layers of a first material and a second material over a substrate;
    etching the stack to form at least one opening in the stack, the at least one opening comprising a tapered opening having an upper portion which is wider than a lower portion;
    forming a masking layer on a sidewall of the upper portion of the at least one opening such that the lower portion of the at least one opening is not covered by the masking layer, and throughout the step of forming the masking layer, the lower portion of the at least one opening comprises physically exposed surfaces of the first material and the second material; and
    further etching the lower portion of the at least one opening to widen the lower portion of the at least one opening while the masking layer remains on the sidewall of the upper portion of the at least one opening.

12. The method of claim 11, wherein:
    the step of etching the stack comprises using reactive ion etching; and
    the step of further etching comprises wet etching or reactive ion etching the first and second material layers of the stack exposed in the lower portion of the at least one opening while the masking layer protects the first and the second material layers in the upper portion of the opening from the further etching.

13. The method of claim 11, wherein:
    the masking layer comprises a non-conformal sidewall spacer; and
    deposition of the non-conformal sidewall spacer is tuned so that its thickness drops from a finite value at the upper portion of the at least one opening to below 1 nm thickness towards the lower portion of the at least one opening.

14. The method of claim 13, wherein the masking layer comprises an amorphous carbon, silicon nitride, silicon oxide, metal oxide or metal nitride masking layer.

15. The method of claim 11, further comprising completely removing the masking layer from the sidewall of the at least one opening.

16. The method of claim 15, wherein the masking layer comprises an amorphous carbon masking layer and the step of removing the masking layer from the sidewall comprises ashing the amorphous carbon masking layer.

17. The method of claim 15, wherein the step of removing the masking layer from the sidewall comprises selectively wet etching the masking layer.

18. The method of claim 11, further comprising:
forming an etch stop layer under the stack;
forming a hard mask over the stack; and
patterning the hard mask to form at least one hard mask opening which exposes the stack;
wherein etching the stack comprises etching the stack through the at least one hard mask opening to form the at least one opening extending through the entire stack to the etch stop layer; and
wherein forming the masking layer comprises forming the masking layer over an upper surface of the hard mask in addition to forming the masking layer on the sidewall of the upper portion of the at least one opening.

19. The method of claim 11, further comprising:
forming a blocking dielectric in the at least one opening;
forming a charge storage layer over the blocking dielectric;
forming a tunnel dielectric over the charge storage layer; and
forming a semiconductor channel over the tunnel dielectric in the at least one opening.

20. The method of claim 19, wherein:
the semiconductor device comprises a monolithic three dimensional NAND string;
the first material comprises a conductive or semiconductor control gate material; and
the second material comprises an insulating material.

21. The method of claim 11, further comprising:
forming the masking layer over an upper surface of the stack in addition to forming the masking layer on the sidewall of the upper portion of the at least one opening; and
forming an additional hard mask over a portion of the masking layer located over the upper surface of the stack;
wherein further etching comprises further etching the lower portion of the at least one opening through the additional hard mask to widen the lower portion of the at least one opening.

22. The method of claim 13, wherein:
the deposition of the non-conformal sidewall spacer is tuned so that its thickness drops from a finite value at the upper portion of the at least one opening to zero between 50% and 75% of a depth of the at least one opening; and
the lower portion of the at least one opening comprises a lower 25 to 50% of the depth of the at least one opening.

23. A method of making a semiconductor device, comprising:
forming a stack of alternating layers of a first material and a second material over a substrate;
etching the stack to form at least one opening in the stack, the at least one opening comprising a tapered opening having an upper portion which is wider than a lower portion;
forming a masking layer on a sidewall of the upper portion of the at least one opening while the lower portion of the at least one opening is not covered by the masking layer;
further etching the lower portion of the at least one opening to widen the lower portion of the at least one opening while the masking layer remains on the sidewall of the upper portion of the at least one opening; and
completely removing the masking layer from the sidewall of the at least one opening.

* * * * *